United States Patent [19]

Huntington

[11] Patent Number: 4,675,557

[45] Date of Patent: Jun. 23, 1987

[54] CMOS VOLTAGE TRANSLATOR

[75] Inventor: Robert C. Huntington, Phoenix, Ariz.

[73] Assignee: Motorola Inc., Schaumburg, Ill.

[21] Appl. No.: 841,977

[22] Filed: Mar. 20, 1986

[51] Int. Cl.[4] .................. H03K 19/092; H03K 3/01; H03K 3/353; H01L 9/02
[52] U.S. Cl. ......................... 307/475; 307/200 B; 307/297; 307/304; 323/314
[58] Field of Search ............. 307/200 B, 296 R, 297, 307/303, 475, 304; 323/311, 313-314

[56] References Cited

U.S. PATENT DOCUMENTS 4,300,061 11/1981 Mihalich et al. ................. 307/297
4,380,710 4/1983 Cohen et al. ..................... 307/585

FOREIGN PATENT DOCUMENTS 3138558 4/1983 Fed. Rep. of Germany ...... 323/313

Primary Examiner—Stanley D. Miller
Assistant Examiner—M. R. Wambach
Attorney, Agent, or Firm—Dale E. Jepsen

[57] ABSTRACT

A voltage translator circuit is provided to reduce a supply voltage to a lower, predetermined, relatively constant and unconditionally stable operating voltage without the use of external components. A voltage divider comprising a plurality of series connected CMOS FETs located in P-regions, is used to establish an operating voltage. Additional CMOS FETs are used to supply the load current and control the no-load voltage.

9 Claims, 8 Drawing Figures

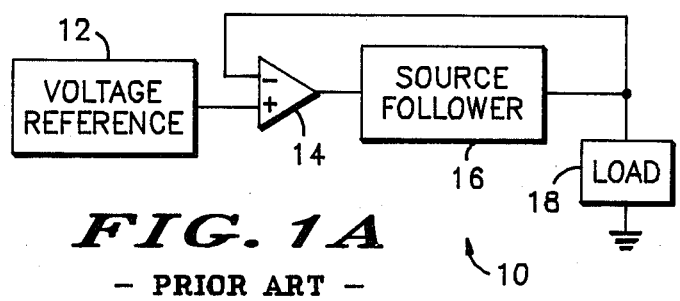
FIG. 1A — PRIOR ART —
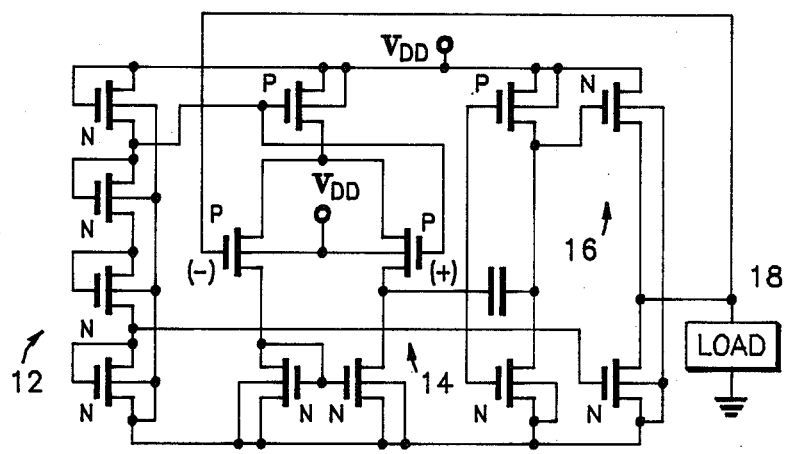
FIG. 1B — PRIOR ART —
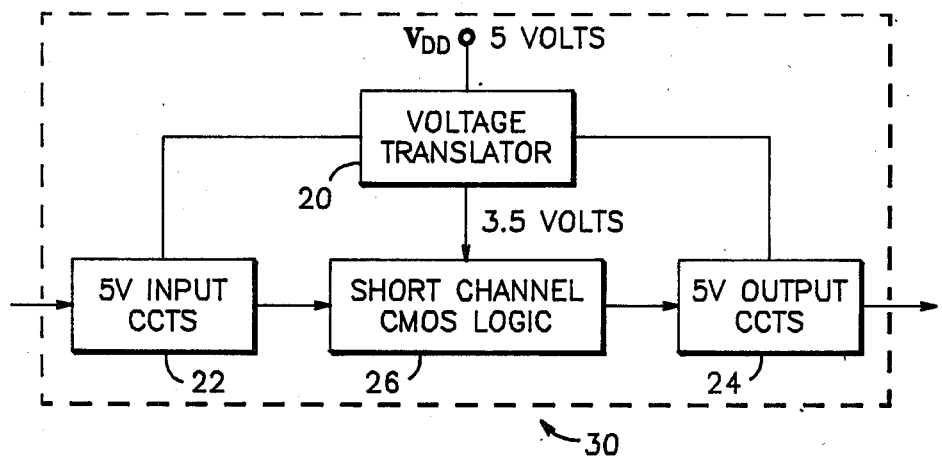
FIG. 2

CMOS VOLTAGE TRANSLATOR

BACKGROUND OF THE INVENTION

This invention relates generally to voltage translator circuits and more particularly to a complementary metal oxide semiconductor (CMOS) voltage translator circuit for use with reduced geometry CMOS integrated circuits.

As CMOS devices are implemented with shorter channel lengths in order to achieve faster operation and increase layout density, it becomes necessary to operate these devices at a reduced supply voltage level to avoid channel punch-through. However, usually these reduced geometry circuits must operate with the same higher voltage supply as other devices not subject to this supply voltage limitation. A voltage translator circuit is therefore required on a short channel CMOS integrated device to reduce the supply voltage to a predetermined level.

SUMMARY OF THE INVENTION

It is an object of the present invention to provide an on chip circuit which reduces the supply voltage to a predetermined level.

It is a further object of the present invention, to provide a voltage translator circuit with reduced chip area.

It is a still further object of the present invention to provide a voltage translator circuit which is unconditionally stable and does not require an external capacitor to provide stability.

A still further object of the present invention is to provide a voltage translator circuit which provides an output voltage which is relatively constant over a wide variation in load current.

The above and other objects of the invention are provided by a CMOS voltage translator circuit comprising voltage divider means for coupling to first and second voltage sources, voltage output means coupled to the voltage dividing means and to the first voltage source for supplying voltage to a load, and voltage control means coupled to the second voltage source, coupled to the voltage dividing means, and coupled to the voltage output means for maintaining the voltage at a given value.

BRIEF DESCRIPTION OF THE DRAWINGS

FIG. 1A is block diagram of a typical prior art voltage translator circuit.

FIG. 1B is a schematic diagram of a typical prior art voltage translator circuit such as that shown in FIG. 1A.

FIG. 2 is a block diagram showing how the inventive voltage translator circuit would be used to couple short channel CMOS logic to conventional 5-volt circuits.

DESCRIPTION OF THE PREFERRED EMBODIMENT

Referring to FIG. 1A there is shown a typical prior art voltage translator circuit which might use a CMOS topology as shown in FIG. 1B. Such a circuit is process sensitive in that variations of device thresholds and transconductances could affect amplifier stability by shifting pole and zero locations. These variations could also cause significant gain changes and could alter the voltage divider output due to the varying body effect in the higher FETs in divider chain 12. In addition a phase compensating capacitor would probably be required either externally or within the integrated circuit to provide the desired stability.

Figures 3A, 3B:
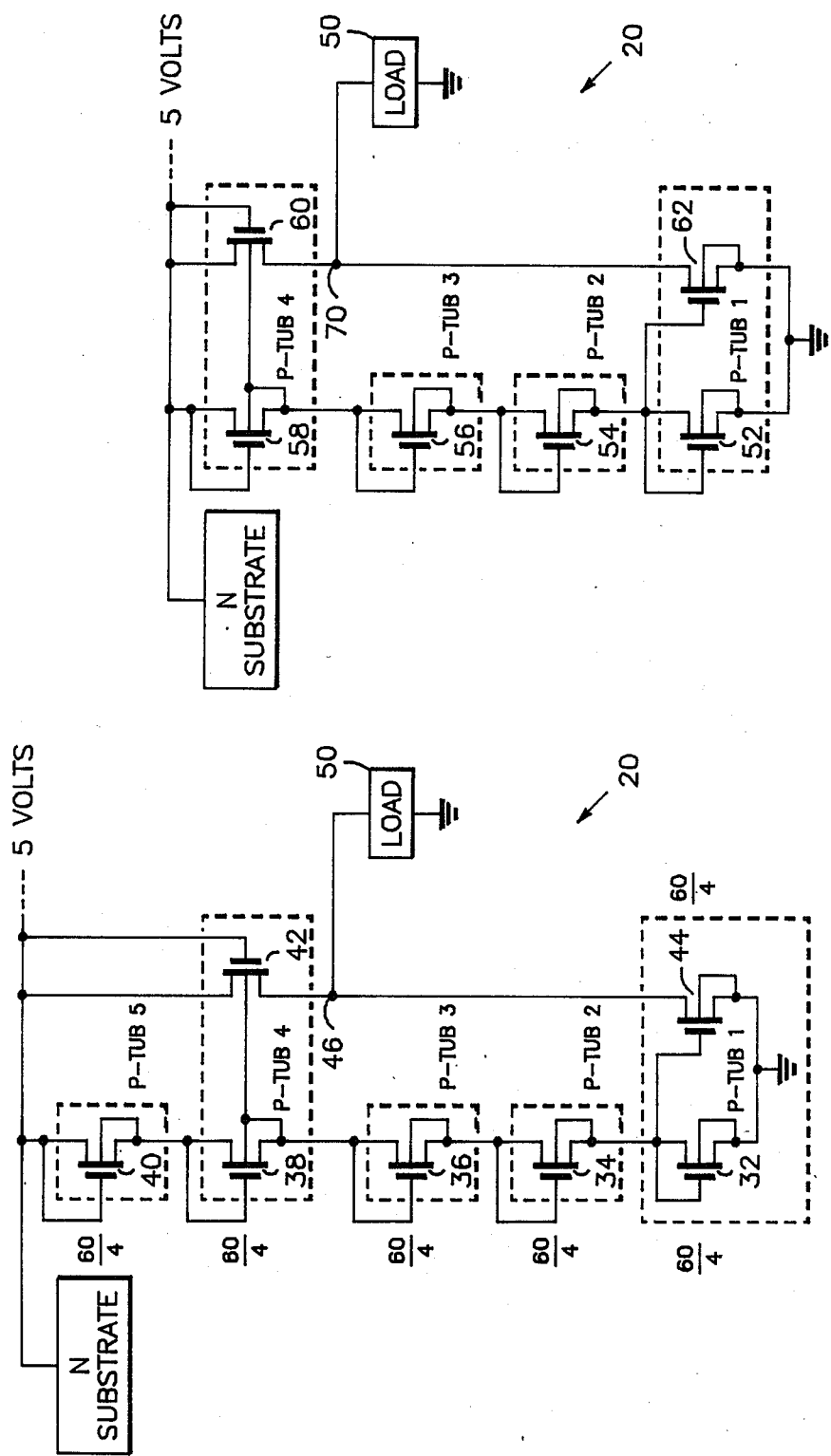
FIG. 3A is a schematic diagram of one embodiment of the inventive voltage translator circuit.
FIG. 3B is a schematic diagram of an alternative embodiment of the inventive voltage translator circuit.

The preferred embodiment of the inventive voltage translator circuit is shown in FIG. 3B. N channel CMOS FET's 52, 54, 56, 58, 60 and 62 are contained in various isolated P regions as indicated by the dotted lines. In FIG. 3B these isolated P well (P tub) regions are constructed above an N substrate material as is well known in the art. The gate and drain electrodes of transistors 58 and 60 are tied to a source of supply voltage while the source element of transistor 58 is tied to the P tub which contains transistors 58 and 60. The source element of transistor 60 is tied to load 50. The source element of transistor 58 is also tied to the gate and drain of transistor 56. The source element of transistor 56 is tied to the P tub which contains transistor 56 as well as to the gate and drain of transistor 54. The source element of transistor 54 is tied to the P tub which contains transistor 54. The source element of transistor 54 is also connected to the gate and drain elements of transistor 52 and to the gate element of transistor 62. The source element of transistor 52 and the source element of transistor 62 are tied to the P tub which contains transistors 52 and 62 and also are tied to a negative reference with respect to the supply voltage. The drain element of transistor 62 is connected to the source element of transistor 60. The N substrate upon which the integrated circuit is constructed is also connected to the source of supply voltage.

In operation transistors 52, 54, 56, and 58 constitute a precise voltage divider because their geometries are identical, each gate is tied to its associated drain, and all four threshold voltages are the same because each P tub is tied to the source of its associated N channel FET. For a supply voltage of five volts this precise voltage divider network produces a voltage at the source of transistor 58, and therefore the P tub containing transistors 58 and 60, of approximately 3.75 volts. Transistor 60, which is the driver which supplies load current, is located in P tub 4 which is held at 3.75 volts by the source terminal of transistor 58. Transistor 62 is made physically smaller than transistor 60 and is sized relative to transistor 60 such that the output voltage at node 70 is close to the desired 3.75 volts over a wide range of current values in the load. The gate of transistor 62 is held at the drain and gate voltage of transistor 52 as shown in FIG. 3b.

As load current increases, the source voltage for transistor 60 drops, but source current in transistor 60 will increase because the back gate voltage is held at the constant voltage of the source of transistor 58 and its front gate remains at the 5 volt supply voltage. This causes the source to gate voltage of transistor 60 to increase for both the front and back gates thus significantly increasing transistor 60 drain current and minimizing the incremental increase in its drain to source voltage drop. The relative physical size of transistors 60 and 62 together with the voltage at which P-tub 4 is held will determine the output voltage range for a given load current range.

Figure 3C:
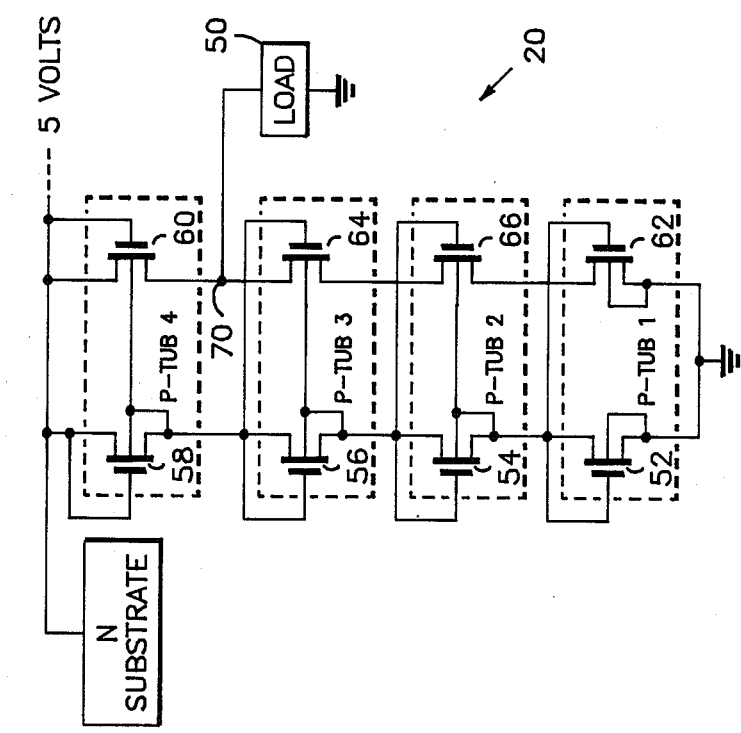
FIG. 3C is a schematic diagram of an additional embodiment of the inventive voltage translator circuit.

In an alternative embodiment of the inventive voltage translator circuit shown in FIG. 3C transistors 66 and 64 are added between transistors 60 and 62 as an aid in maintaining no load output voltage. Virtually any voltage reduction can be obtained by proper selection of the number and relative sizes (to determine channel conductances) of devices in the voltage divider chain and the location of the output voltage device. For example, in FIG. 3A the voltage at the source of transistor 38 and therefore the approximate output voltage of the device would be 3/5ths of the supply voltage or 3.0 volts if the supply voltage were 5 volts and the transistors in the divider chain were all the same size. Here the output voltage would be increased by increasing the size of transistor 40 thus increasing its channel conductance and raising the voltages at its P-tub and source and each of the other divider nodes in the chain.

Figure 4A:
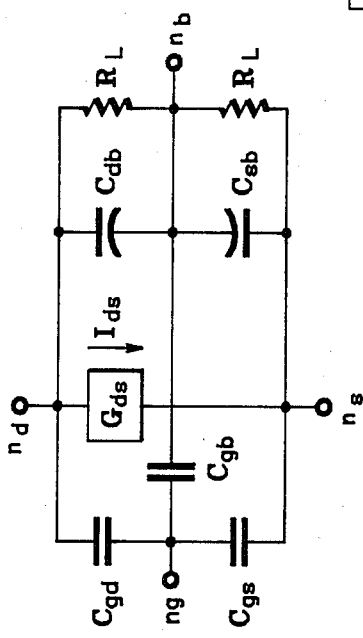
FIG. 4A is a four terminal model for a metal oxide semiconductor field effect transistor (MOSFET).
Figure 4B:
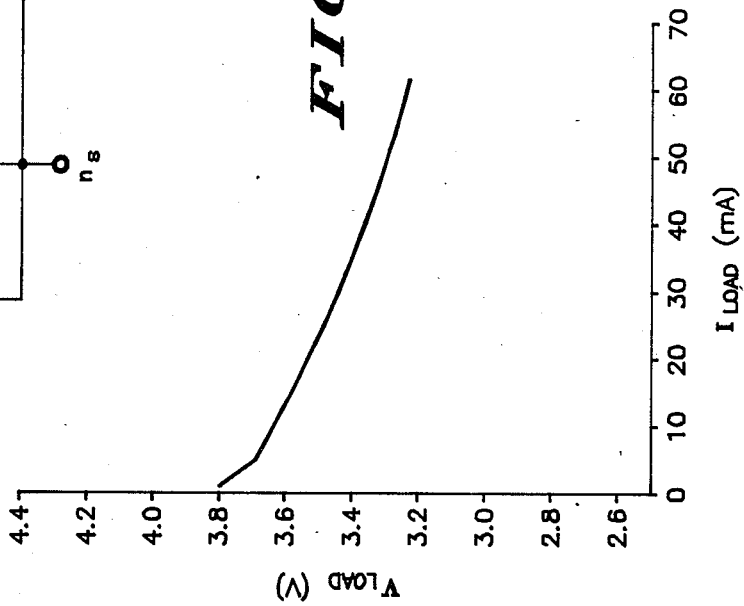
FIG. 4B is a graph illustrating a typical variation of load voltage versus load current for the inventive voltage translator circuit.

The output voltage level is controlled by locating the active device of an output N channel source follower, transistor 60, in a P tub which is held at the proper potential by a device in the divider chain as shown in FIG. 3B. The gate and drain of the source follower 60 are both tied directly to the supply voltage. The source follower load device 62 is located in a P tub which is tied to ground and is operated as a current mirror for the lowest device on the voltage divider chain. What this configuration accomplishes can be further described with reference to FIG. 4A which is the generally accepted four terminal model for a MOSFET. The drain to source current ($I_{ds}$) and channel conductance ($G_{ds}$) are functions of the drain to source voltage ($V_{ds}$) the gate to source voltage ($V_{gs}$) and the source to bulk voltage ($V_{sb}$). With respect to this model it can be seen that the stucture of FIG. 3B fixes both the gate and drain at the highest voltage available, thus maximizing both $V_{gs}$ and $V_{ds}$ and, as a result, maximizing available current and conductance while it holds the bulk (P tub) at a voltage which is the reference level for $V_{sb}$. The effect of fixing the bulk potential is to hold the source voltage (i.e. the output voltage) nearly constant over a significant current range as shown in FIG. 4B which illustrates the calculated variation of output voltage $V_{load}$ with output current $I_{load}$ using a specific configuration of the circuit shown in FIG. 3B. The function of the current mirror source follower load device 62 is to help control the no load output voltage.

The above description is given by way of example only. Changes in form and details may be made by one skilled in the art without departing from the scope of the invention.

I claim:

1. A voltage translator circuit comprising:
   voltage dividing means having first and second input terminals and first and second output terminals, said first input terminal for coupling to a first voltage source and said second input terminal for coupling to a second voltage source;
   voltage output means comprising an output transistor having first and second terminals and first and second control terminals, said first terminal and said first control terminal of said output transistor coupled to said first input terminal, said second control terminal of said output transistor coupled to said first output terminal of said voltage dividing means, and said second terminal of said output transistor for supplying voltage to a load; and
   voltage control means, coupled to said second output terminal of said voltage dividing means, to said second input terminal of said voltage dividing means and to said second terminal of said output transistor, for maintaining the voltage at said load at predetermined value.

2. The circuit of claim 1 wherein said voltage dividing means comprises:
   a first transistor having first and second terminals and a control terminal, said first terminal and said control terminal coupled to said first input terminal and said second terminal coupled to said second control terminal of said voltage output means;
   a second transistor having first and second terminals and a control terminal, said first terminal and said control terminal of said second transistor coupled to said second terminal of said first transistor;
   a third transistor having first and second terminals and a control terminal, said first terminal and said control terminal of said third transistor coupled to said second terminal of said second transistor; and
   a fourth transistor having first and second terminals and a control terminal, said first terminal and said control terminal of said fourth transistor coupled to said second terminal of said third transistor, said second terminal of said third transistor coupled to said voltage control means and said second terminal of said fourth transistor coupled to said second input terminal.

3. The circuit of claim 2 wherein said voltage control means comprises a fifth transistor having first, second and control terminals, said first terminal of said fifth transistor coupled to said second terminal of said output transistor, said control terminal of said fifth transistor coupled to said first terminal of said fourth transistor and said second terminal of said fifth transistor coupled to said second input terminal.

4. The circuit of claim 3 wherein said transistors comprise CMOS FETs.

5. The circuit of claim 3 wherein said first and output transistors are formed in a first isolated region of a first type semiconductor material, said second transistor is formed in a second isolated region of said first type semiconductor material, said third transistor is formed in a third isolated region of said first type semiconductor material and said fourth and fifth transistor are formed in a fourth isolated region of said first type semiconductor material.

6. The circuit of claim 5 wherein said isolated regions of said first semiconductor material are formed on a substrate of a second type semiconductor material.

7. The circuit of claim 6 wherein said substrate is coupled to said first voltage source.

8. The circuit of claim 3 wherein the physical sizes of said output transistor and said fifth transistor are scaled to provide the desired no-load voltage at said second terminal of said output transistor.

9. The circuit of claim 1 wherein said voltage dividing means comprises a plurality of series connected transistors coupled from said first voltage source to said second voltage source.

* * * * *